Jan. 26, 1965 HIROSHI YAMAMOTO ETAL 3,167,737

SEMICONDUCTOR DEVICE

Filed Jan. 3, 1964

INVENTORS
HIROSHI YAMAMOTO
KOICHI IKEDA

BY

Hopgood & Calimafde
ATTORNEYS 3,167,737
Patented Jan. 26, 1965

3,167,737

SEMICONDUCTOR DEVICE

Hiroshi Yamamoto and Koichi Ikeda, both of Tokyo, Japan, assignors to Nippon Electric Company Limited, Tokyo, Japan, a corporation of Japan Filed Jan. 3, 1964, Ser. No. 335,601
Claims priority, application Japan, Feb. 4, 1963, 38/4,502
4 Claims. (Cl. 338—316)

This invention relates to a semiconductor device, and more particularly to means for mounting a semiconductor therein.

In the assembly of silicon rectifiers, a silicon semiconductor element having a p-n junction is directly mounted on a copper stud which is a good conductor of both heat and electricity. Cracks, breaks and strains, however, often result due to heating and cooling during the soldering process or during operation of the device, due to the difference in thermal expansion coefficients of the silicon and copper, thereby damaging the rectifier and deteriorating its characteristics. The effect of the differences in expansion increase with increasing area of the semiconductor element.

In one construction which has been devised to eliminate these defects, the semiconductor element is soldered to the copper stud through the medium of a metal plate, such as tungsten or molybdenum, which has a relatively low thermal expansion coefficient close to that of the silicon rectifier element, however, this has not been a satisfactory solution to the problem of cracks, breaks or strains. Other constructions have also been devised, however none of these has proven entirely satisfactory.

Accordingly, it is an object of this invention to eliminate the disadvantages of the prior art semiconductor constructions described above.

It is another object to make available a more reliable semiconductor device.

Figure 1:
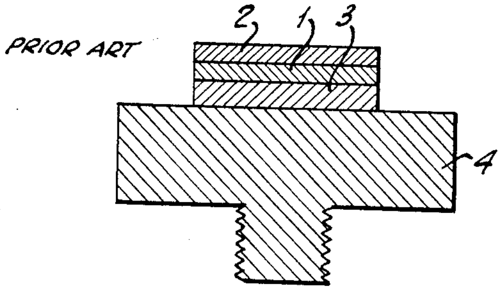
Figure 2:
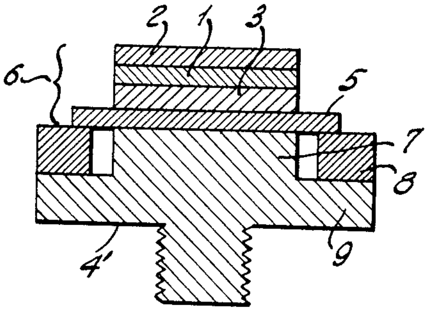
Figure 3:
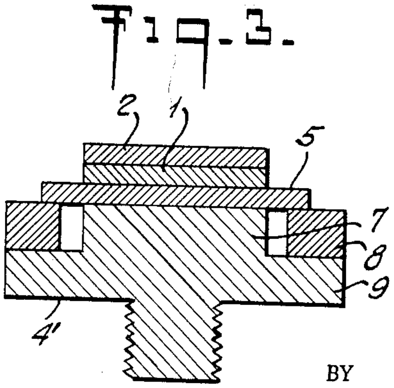

All of the objects, features and advantages of this invention and the manner of attaining them will become more apparent and the invention itself will be best understood by reference to the following description of an embodiment of the invention taken in conjunction with the accompanying drawing, in which:

FIG. 1 illustrates a sectional view of a conventional semiconductor rectifier, and FIGS. 2 and 3 show sectional views of semiconductor rectifiers made in accordance with the teachings of this invention.

Referring now to FIG. 1, there is shown a conventional construction for a semiconductor rectifier. In this construction, a silicon rectifier element 1 is sandwiched between two metal plates 2 and 3 which have a relatively low thermal expansion coefficient, by soldering at, for example, 600° C. This sub-assembly is then soldered to a copper stud 4 at, for example, 300° C.

However, when the area of the rectifier element 1 is relatively large, even this improved prior art structure is unsatisfactory because of the larger expansion difference between the metal plate 3 having the relatively low thermal expansion coefficient, and the copper stud 4. Thus it will be appreciated that when the plate 3 and the stud 4 are soldered together with a soldering material at 300° C. for example, upon cooling, this bimetallic construction will be deformed in such manner as to produce a shape which is an upwardly convex curve. Such curvature will result in strains, cracks or breaks in the rectifier element.

This invention provides a construction which eliminates these defects, one embodiment thereof being shown in FIG. 2. In this figure, the numeral 1 indicates a semiconductor element, and the numerals 2, 3 and 5 represent metal plates, such as tungsten or molybdenum, which have a thermal expansion coefficient close to that of the semiconductor element. The element 1 and the metal plates 2, 3 and 5 are stacked as shown and are soldered at approximately 600° C., for example, thereby forming a semiconductor sub-assembly 6. In this sub-assembly, the element 1 and the metal plates 2, 3 and 5, are disposed or piled concentrically, and the circumference of the plate 5 extends outwardly beyond the element 1 and the plates 2 and 3.

A base or pedestal portion 7 is formed at the center of the copper stud 4′, and the semiconductor sub-assembly 6 is mounted on this base portion through the medium of solder. The stud 4′ also has a lower flange portion 9. A metal frame 8 which may be in the form of an annular ring of a material such as nickel, iron, or nickel-iron alloy, with a thermal expansion coefficient lower than that of copper, is provided between the flange portion 9 of the copper stud 4′ and the metal plate 5. The sub-assembly 6 is then secured to the stud 4′ by means of solder, which fastens the lower surface of the plate 5 to the top surface of the base portion 7. The solder also fastens the frame 8 to the flange 9 and to the periphery of the lower surface of the plate 5. This construction prevents the convex deformation described above, which is produced in the prior art construction of FIG. 1 during the cooling stage after soldering. The contraction of the copper base portion 7 is greater than that of the metal frame 8, resulting in a stress upon the metal plate 5 which cancels this stress and the stress which caused the element to curve convex upwardly due to the bimetal effect. As a result the semiconductor element 1 is not subjected to mechanical strain as a result of the manufacturing process, nor is it subjected to strain due to expansion and contraction resulting from heat generated during operation. For best design, judicious choice should, of course, be made as to the dimension of the base portion 7 of the copper stud, the type of material and the dimension of the metal frame 8, the type of material and the dimension of the low expansion metal plate 5, and also the dimensions of the gap between the metal frame 8 and the base portion 7 of the copper stud.

FIG. 3 illustrates a further embodiment of the invention in which the low expansion coefficient metal plate 3 shown in FIG. 2 is eliminated, and the metal plate 5 serves the role of both these plates 3 and 5. The remaining portion of the structure is substantially the same as that of FIG. 2. Thus one piece is eliminated in the structure of FIG. 3, however, the advantages of the FIG. 2 construction are retained. The most effective elimination of strain is accomplished by making the structure symmetrical in the longitudinal direction with respect to the semiconductor element 1, and this will also facilitate design and assembly of the component parts of the device.

Although the above explanation has referred to a semiconductor rectifier, it will be apparent to those skilled in the art that this invention may be effectively applied to a high current transistor in which a semiconductor element having a large area is soldered rigidly to a supporting electrode.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A semiconductor device comprising a semiconductor element having a metal plate secured to one surface thereof, supporting means of copper and a metal frame, said metal plate having a coefficient of thermal expansion close to that of said element, said metal plate further having a larger area than the area of said element, said supporting means having a base portion at the center thereof, said metal frame having a smaller coefficient of thermal expansion than that of said copper, said element, said metal plate and said supporting means being physically secured together in coaxial relationship, and said metal frame being inserted between and physically secured to a peripheral portion of said metal plate and a peripheral portion of said supporting means, whereby strains in said semiconductor element due to physical deformation resulting from temperature variations are substantially eliminated.

2. The invention described in claim 1 wherein said metal frame comprises a ring-like member.

3. The invention described in claim 1 which further includes a second metal plate secured to a surface of said semiconductor element opposite said one surface.

4. A semiconductor device comprising a semiconductor element sandwiched between and secured to an upper and a lower metallic plate on opposite surfaces thereof, an enlarged metallic plate secured to said lower plate and having an area larger than the area of said lower plate, said upper plate, said lower plate and said enlarged plate having a coefficient of thermal expansion close to that of said semiconductor element, a metallic supporting member having a lower flange portion and an upper pedestal portion which is smaller in cross-section than said flange portion, said enlarged metallic plate being secured to the top surface of said pedestal portion, and a metallic ring-like member surrounding said pedestal portion and being secured to said flange portion of said member and also to the periphery of said enlarged metallic plate, whereby strains in said semiconductor element due to physical deformation resulting from temperature variations are substantially eliminated.

References Cited in the file of this patent

UNITED STATES PATENTS

| | | |
|---|---|---|
| 2,405,192 | Davis | Aug. 6, 1946 |
| 2,516,873 | Havens et al. | Aug. 1, 1950 |
| 2,983,887 | Wormser | May 9, 1961 |